United States Patent
Gasner et al.

(10) Patent No.: US 8,338,914 B2
(45) Date of Patent: *Dec. 25, 2012

(54) INTEGRATED PROCESS FOR THIN FILM RESISTORS WITH SILICIDES

(75) Inventors: John T. Gasner, Satellite Beach, FL (US); John Stanton, Palm Bay, FL (US); Dustin A. Woodbury, Indian Harbour Beach, FL (US); James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 25 days.

This patent is subject to a terminal disclaimer.

(21) Appl. No.: 12/689,376

(22) Filed: Jan. 19, 2010

(65) Prior Publication Data
US 2010/0117198 A1 May 13, 2010

Related U.S. Application Data

(63) Continuation of application No. 11/870,543, filed on Oct. 11, 2007, now Pat. No. 7,662,692, which is a continuation of application No. 11/101,891, filed on Apr. 8, 2005, now Pat. No. 7,341,958.

(60) Provisional application No. 60/646,189, filed on Jan. 21, 2005.

(51) Int. Cl.
H01L 29/00 (2006.01)
(52) U.S. Cl. ......... 257/537; 257/E27.047; 257/E21.004; 438/720
(58) Field of Classification Search .................. 257/537, 257/E27.047, E23.141, E21.004, E21.351
See application file for complete search history.

(56) References Cited

U.S. PATENT DOCUMENTS

| | | | |
|---|---|---|---|
| 4,755,480 A | 7/1988 | Yau et al. | |
| 5,256,247 A | 10/1993 | Watanabe et al. | |
| 5,547,896 A | 8/1996 | Linn et al. | |
| 5,593,601 A | 1/1997 | Hsieh et al. | |
| 5,847,463 A * | 12/1998 | Trivedi et al. | 257/751 |
| 6,074,960 A | 6/2000 | Lee et al. | |
| 6,365,482 B1 | 4/2002 | Maghsoudnia | |
| 6,518,642 B2 * | 2/2003 | Kim et al. | 257/528 |
| 6,921,962 B1 | 7/2005 | Bailey et al. | |
| 7,341,958 B2 | 3/2008 | Gasner et al. | |
| 7,662,692 B2 * | 2/2010 | Gasner et al. | 438/381 |
| 2005/0003673 A1 | 1/2005 | Mahdavi | |
| 2005/0095844 A1 * | 5/2005 | Saito et al. | 438/630 |

OTHER PUBLICATIONS

Brian Arbuckle et al., "Processing technology for integrated passive devices", Solid State Technology, Nov. 2000, pp. 84-90.*

* cited by examiner

*Primary Examiner* — William D Coleman
(74) *Attorney, Agent, or Firm* — Fogg & Powers LLC

(57) ABSTRACT

The formation of devices in semiconductor material is provided using an HF/HCL cleaning process. In one embodiment, the method includes forming at least one hard mask overlaying at least one layer of resistive material, forming at least one opening to a working surface of a silicon substrate of the semiconductor device, and cleaning the semiconductor device with a diluted HF/HCL process. The HF/HCL process includes applying a dilute of HF for a select amount of time and applying a dilute of HCL for a specific amount of time. After cleaning with the diluted HF/HCL process, a silicide contact junction is formed in the at least one opening to the working surface of the silicon substrate, and interconnect metal layers are formed.

25 Claims, 14 Drawing Sheets

INTEGRATED PROCESS FOR THIN FILM RESISTORS WITH SILICIDES

CROSS REFERENCE TO RELATED APPLICATIONS

This application is a continuation of U.S. application Ser. No. 11/870,543 filed on Oct. 11, 2007, now U.S. Pat. No. 7,662,692, which is a continuation of U.S. application Ser. No. 11/101,891 filed on Apr. 8, 2005, now U.S. Pat. No. 7,341,958, which claims the benefit under 35 U.S.C. §119(e) of U.S. Provisional Application No. 60/646,189 filed Jan. 21, 2005, all of which are incorporated by reference herein.

BRIEF DESCRIPTION OF THE DRAWINGS

The present invention can be more easily understood and further advantages and uses thereof are more readily apparent, when considered in view of the detailed description and the following figures in which.

In accordance with common practice, the various described features are not drawn to scale but are drawn to emphasize specific features relevant to the present invention. Like reference characters denote like elements throughout the figures and text.

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the invention. The following detailed description is, therefore, not to be taken in a limiting sense, and the scope of the present invention is defined only by the claims and equivalents thereof.

In the following description, the term "substrate" is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal plane" or "lateral plane" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "overlaying", "top" and "under" are defined with respect to the conventional plane or working surface being on the top surface of the wafer or substrate, regardless of the orientation of the wafer or substrate.

The present invention provides relatively high performance devices formed on a wafer such as resistors, silicide contacts and capacitors. In one embodiment, a fabrication process allows relatively high matching resistors and silicide contact junctions to be built on the same wafer. In one embodiment, the resistors are formed from chromium silicon (CrSi) and the silicide contact junctions are formed with platinum silicon (PtSi). In various embodiments, an improved hard mask process is used. In particular, a pre-platinum silicide cleaning process of diluted HF and diluted HCL (HF/HCL clean process) is used in embodiments of the present invention. Further in one embodiment, a sequence of process steps include the use of TiN hard mask, dry etch, the pre-platinum cleaning, and a final hydrogen peroxide clean prior to metal interconnect deposition. The HF/HCL clean process allows for good silicides to form but does not attack (or degrade) hard masks used in the process to form resistors.

Figure 1:
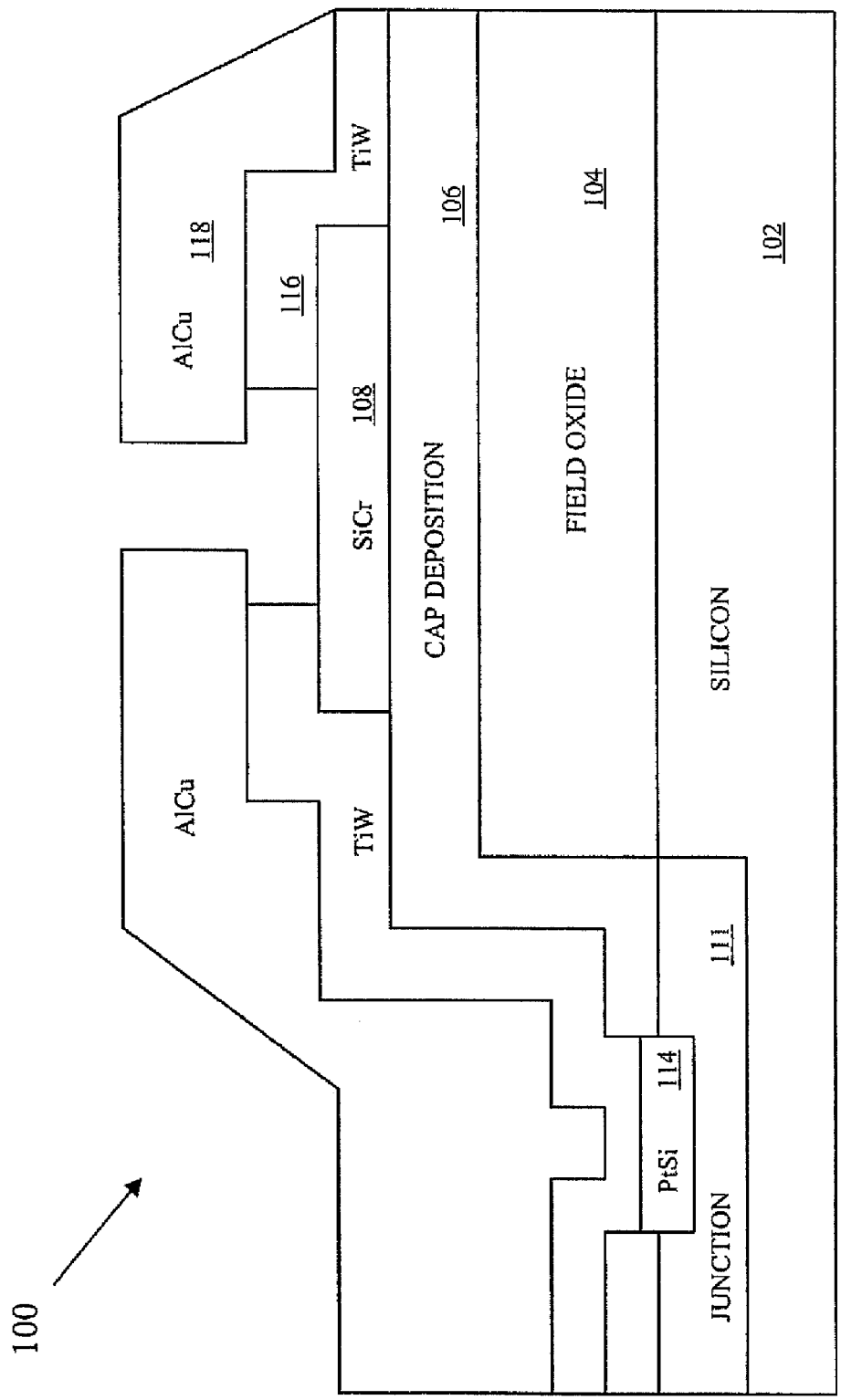
FIG. 1 is a cross-sectional view of a device of one embodiment of the present invention.

Referring to FIG. 1, a semiconductor structure 100 of one embodiment of the present invention is illustrated. As shown, this embodiment includes an oxide layer 106, a resistor layer 108, silicide contact junction 114 and a device junction 111. The junction 111 is an area formed in a device region of the substrate 102 that is doped to provide select semiconductor characteristics. The oxide layer 106 separates the interconnect metal from the device regions. The interconnect metal layer in this embodiment includes the TiW layer 116 and the AlCu layer 118. In other embodiments, other types of conductive layers are used to form the interconnect layer. In general, the device region is formed in the substrate 102 beneath the interconnect metal. The oxide layer 106 is formed to have a high enough breakdown to prevent shorts between the interconnect metal and the device regions. The oxide layer 106 can also serve a capacitor if the device region is highly doped. If this is the case, the oxide layer 106 can be referred to as a capacitor deposition (cap dep) layer 106. The junctions of the devices formed in the substrate 102 are connected through silicide contact 114.

The semiconductor structure 100 of FIG. 1 and in particular the resistive layer 108 and interconnect metal layers 116 and 118 can be used as a conventional resistor in an integrated circuit. The active part of the resistor is layer 108 which is, in this embodiment, a layer of SiCr 108. In another embodiment a layer 108 of NiCr is used. The AlCu lines 118 are connected to other devices in an integrated circuit to form a circuit with the resistor. In particular, a conventional thin film resistor is formed from layers 108, 116 and 118 which can be used in an integrated circuit. The SiCr resistor layer 108 in this embodiment has a relatively high sheet resistance of approximately 2K ohms/square. This makes the resistor especially valuable for circuits operating at a relatively high voltage (higher than 15 volts).

Figure 2A:
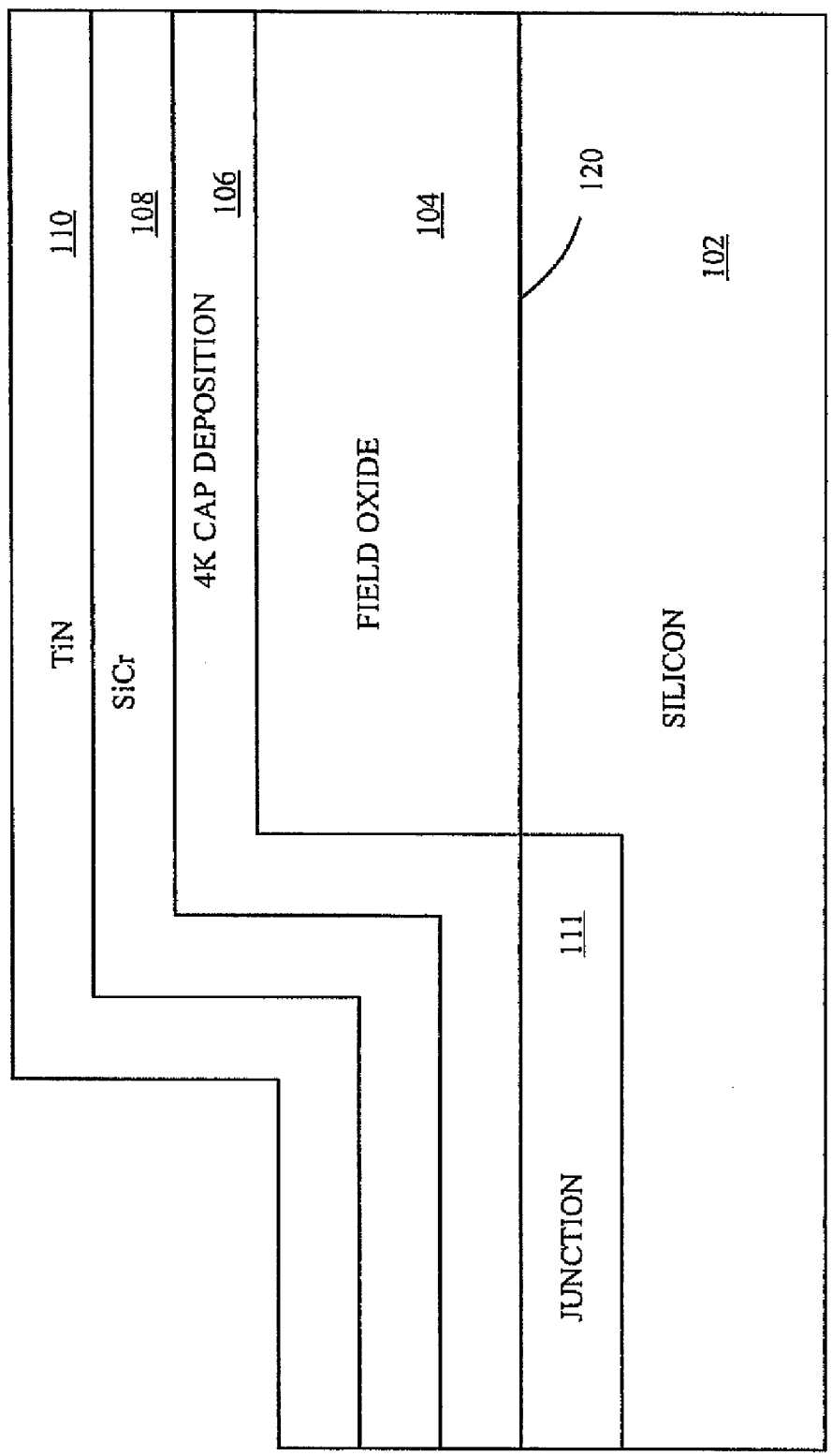
FIG. 2A-2H are cross-sectional views of the formation of a device of one embodiment of the present invention.

FIGS. 2A through 2H illustrate the formation of semiconductor structure 100 using one method of the present invention. Referring to FIG. 2A, a field oxide 104 is deposited and patterned on a silicon wafer 102 (substrate 102). In one embodiment, the field oxide 104 is used as a mask to define an edge of the doped device junction 111. A 4K oxide layer 106 (cap dep layer 106) is deposited overlaying the field oxide 104 and a working surface 120 of the substrate 102. A SiCr layer 108 is then deposited overlaying the oxide layer 106. The SiCr layer 108 in this embodiment will be formed into a thin film resistor. A hard mask layer of TiN 110 is then formed overlaying the SiCr layer 108. In another embodiment, a hard mask layer of TiW is used.

Figure 2B:
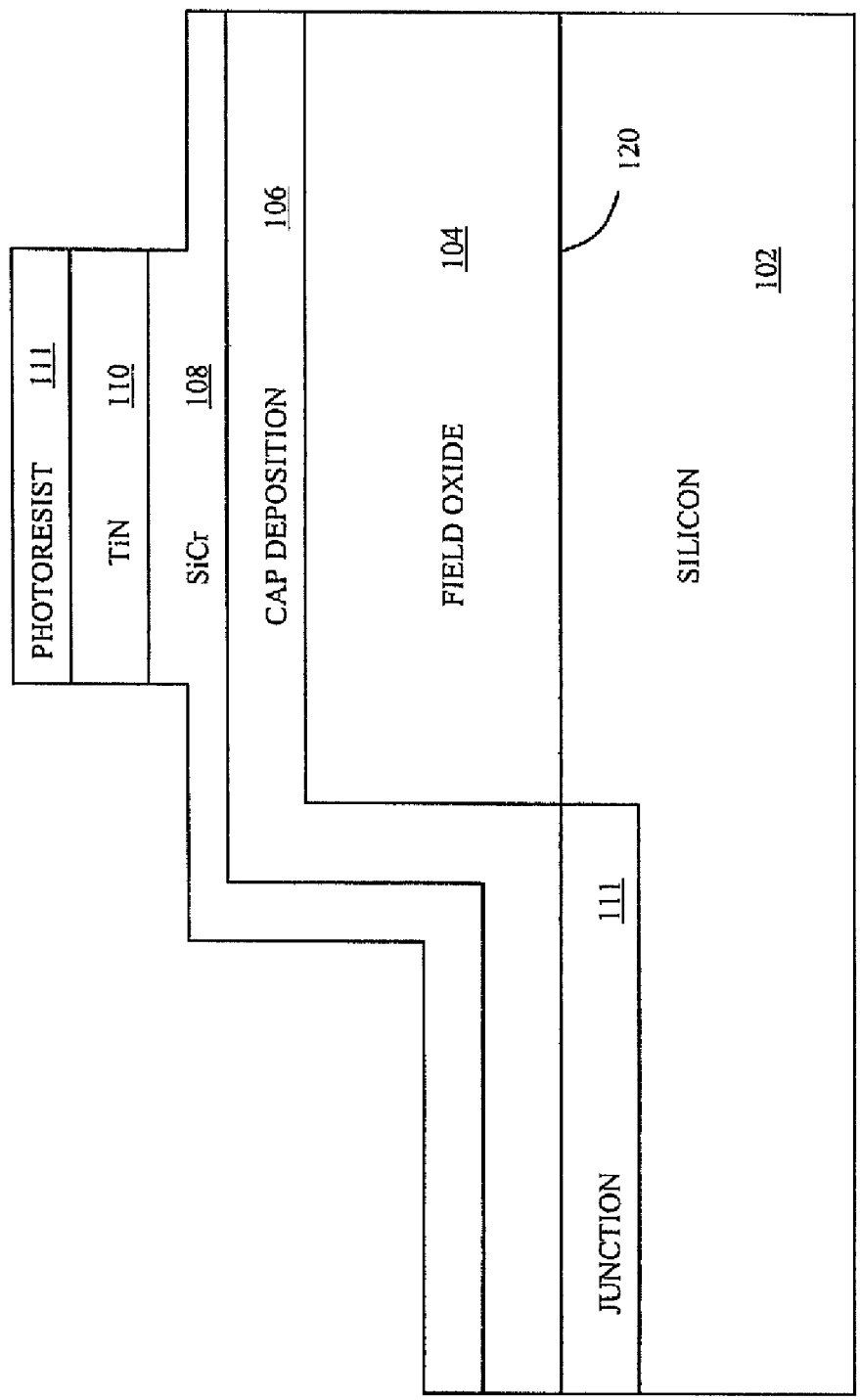
Figure 2C:
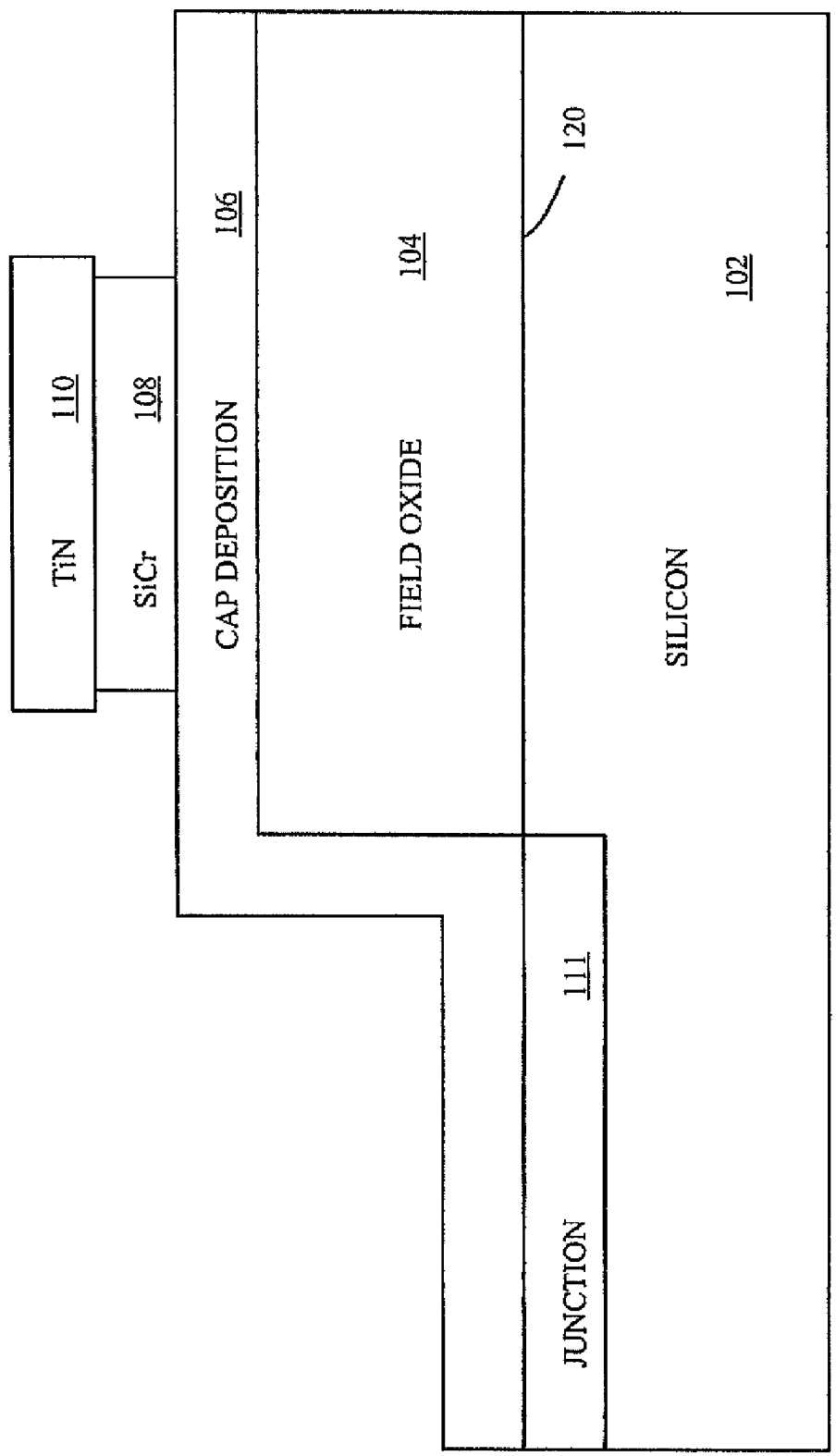

FIG. 2B illustrates a patterned resist 111 that is used with a timed dry etch, which removes all of the TiN layer and some of the SiCr layer in select areas as illustrated. As illustrated, the working surface of the silicon layer 102 is not exposed in this step. In FIG. 2C, a solvent strip is used to remove the patterned resist 111 and a standard SiCr wet etch is then performed to form a resistor in this embodiment. In other embodiments, other methods of patterning a thin film resistor can be used. As illustrated, more of the SiCr layer 108 has been removed during this process.

Figure 2D:
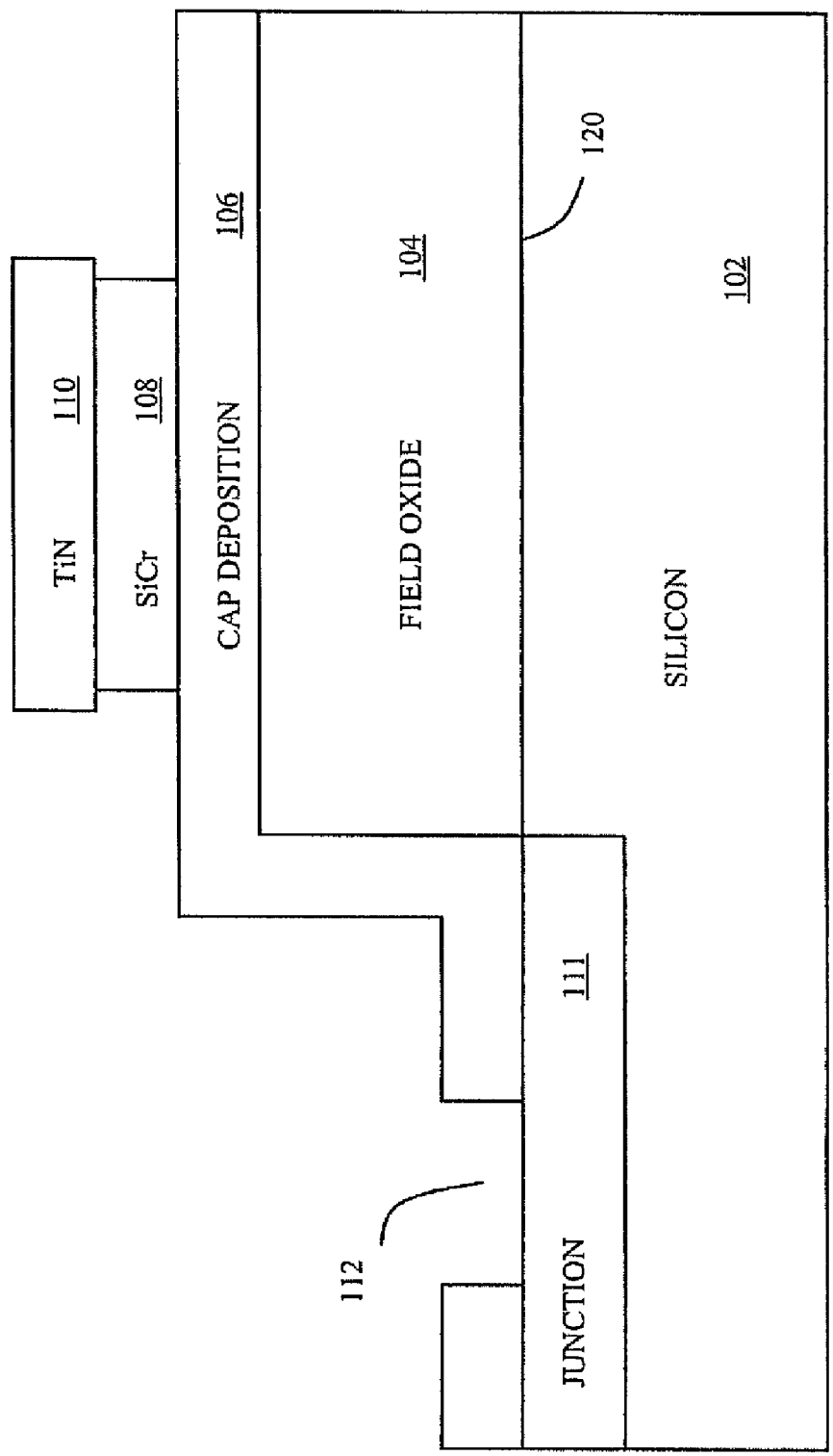
Figure 2E:
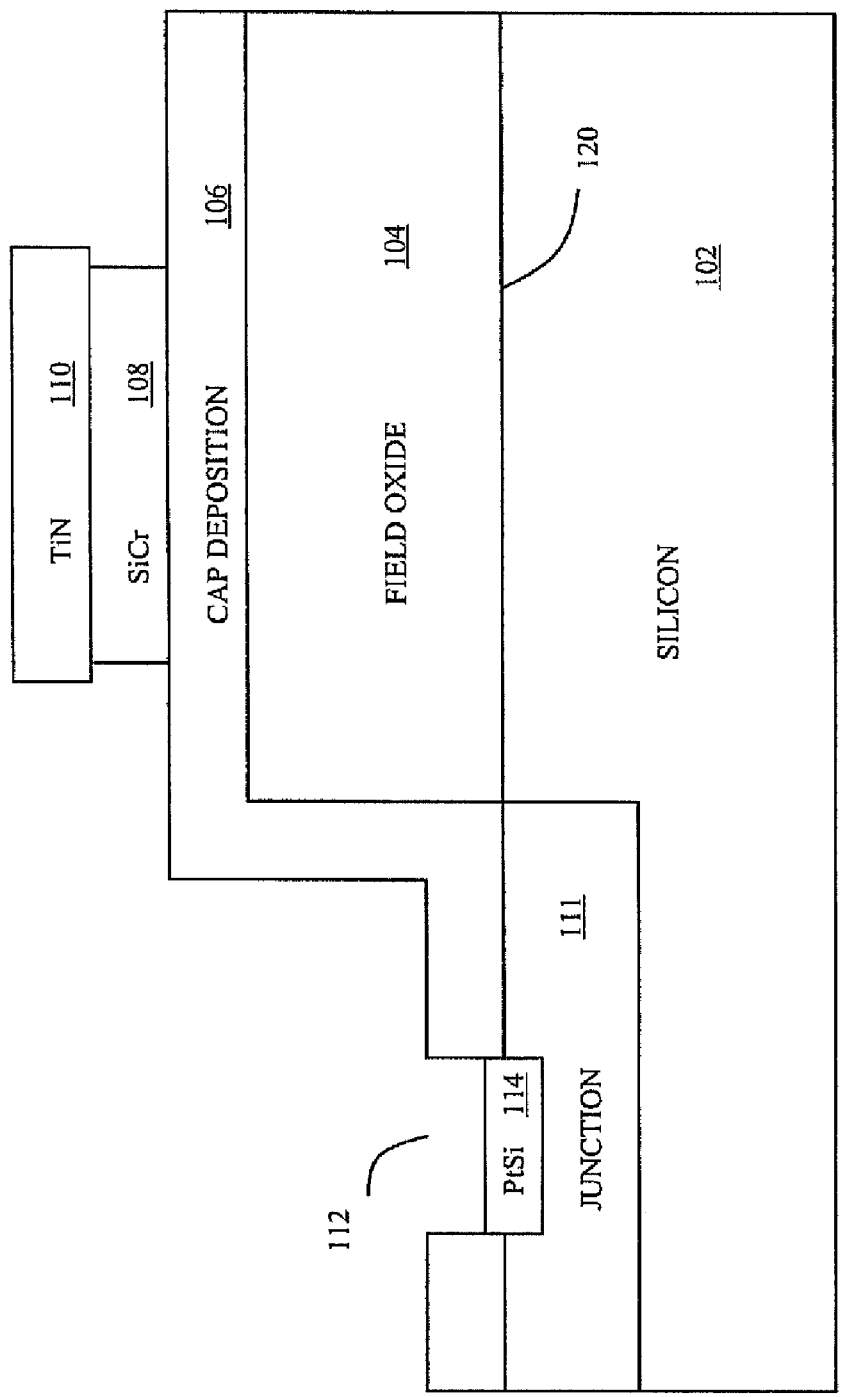

Referring to FIG. 2D, an etch is performed through the oxide layer 106 to form a contact opening 112 to the working surface of the silicon substrate 102 adjacent junction 111. The HF/HCL clean process is then applied to the semiconductor device, and then the Pt is deposited to form a PtSi contact junction 114 (silicide contact junction) as illustrated in FIG. 2E. Silicide contact junctions provide low resistance electrical silicide contacts to device junctions formed in substrates such as junction 111 of FIG. 2E. As indicated above, the HF/HCL clean process does not degrade the TiN mask 110. In one embodiment, the HF/HCL clean process includes a 40:1 dilute of HF that is applied for approximately 60 seconds and a 6:1 HCL at approximately 50 C° that is applied for approximately 70 seconds. In one embodiment, a sinter and aqua regia process is used after the PtSi contact 114 is formed. The aqua regia attacks and removes a portion but not the entire TiN hard mask 110.

Figure 2F:
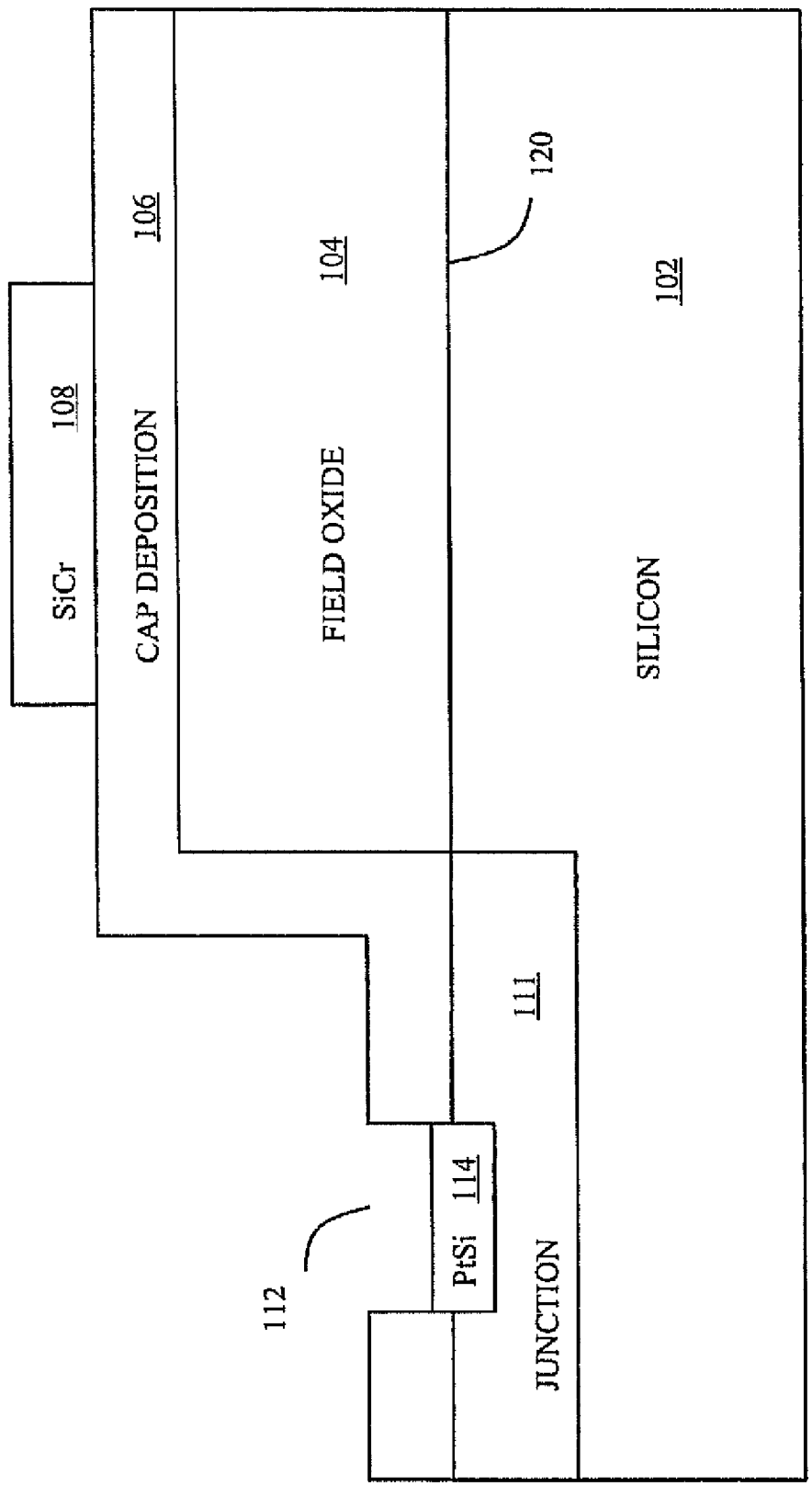
Figure 2G:
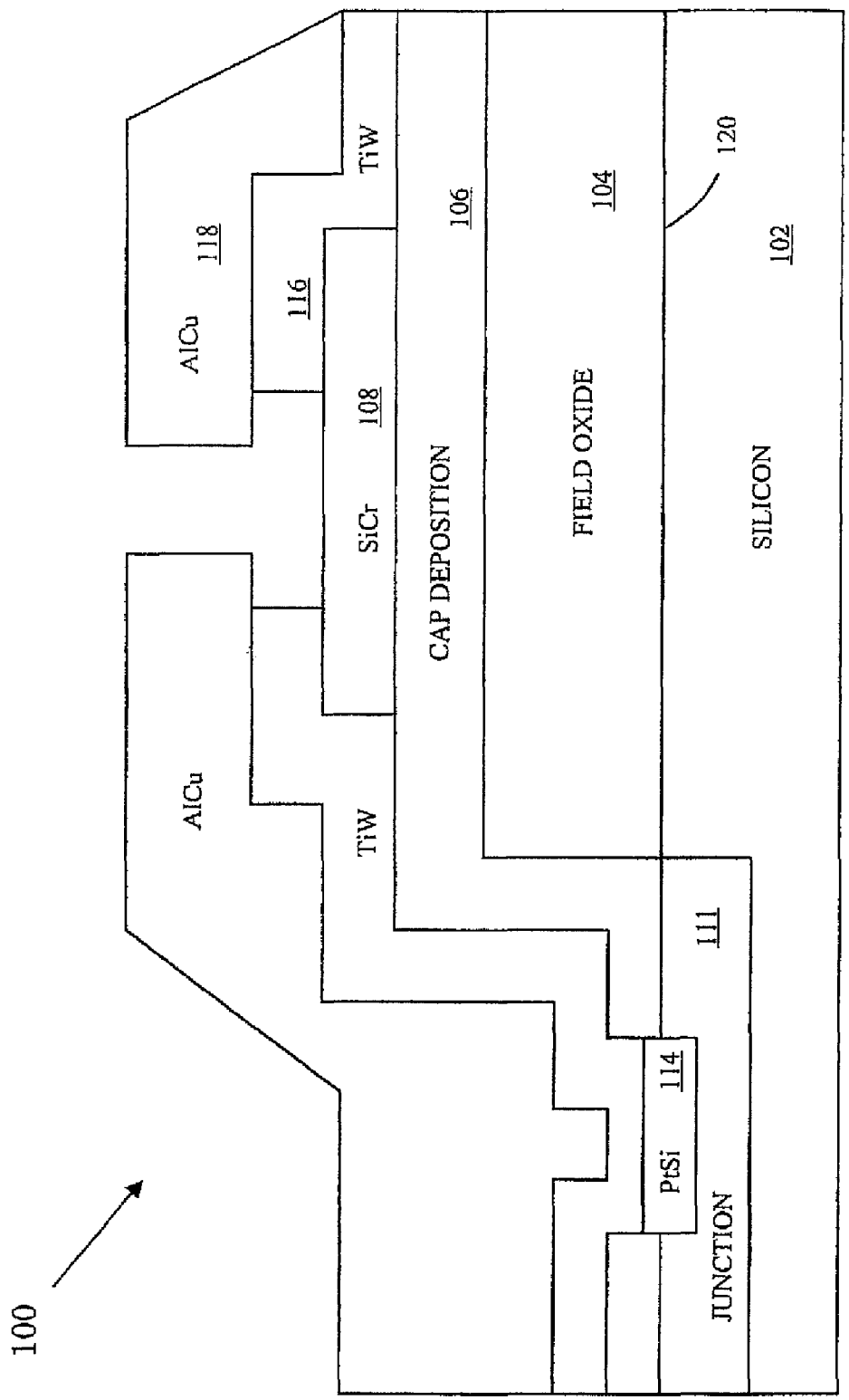

The TiN hard mask 110 is then etched away as illustrated in FIG. 2F. In one embodiment, this is a hydrogen peroxide etch that does not effect the SiCr layer 108, and the PtSi in the silicide contact junction 114. The interconnect metal layers are then formed on the substrate. By using the processes discussed above, a pre-Al dip of the prior art is not required before the metal layers are formed. Referring to FIG. 2G, the formation of the interconnect metal layers is illustrated. In one embodiment, a first interconnect layer of TiW 116 and a second interconnect layer of AlCu 118 is deposited and patterned to form the first and second interconnect metal layers 116 and 118 of the semiconductor structure 100. In particular, in one embodiment, the AlCu layer 118 is patterned with a plasma dry etch. The TiW acts as a stopping layer to protect the SiCr layer 108 from the plasma dry etch. The TiW is then patterned with a wet etch to expose a select portion of the SiCr 108 layer. In one embodiment the wet etch is a peroxide wet etch that does not affect the SiCr 108 layer. In another embodiment the first interconnect layer is made from TiN.

Figure 2H:
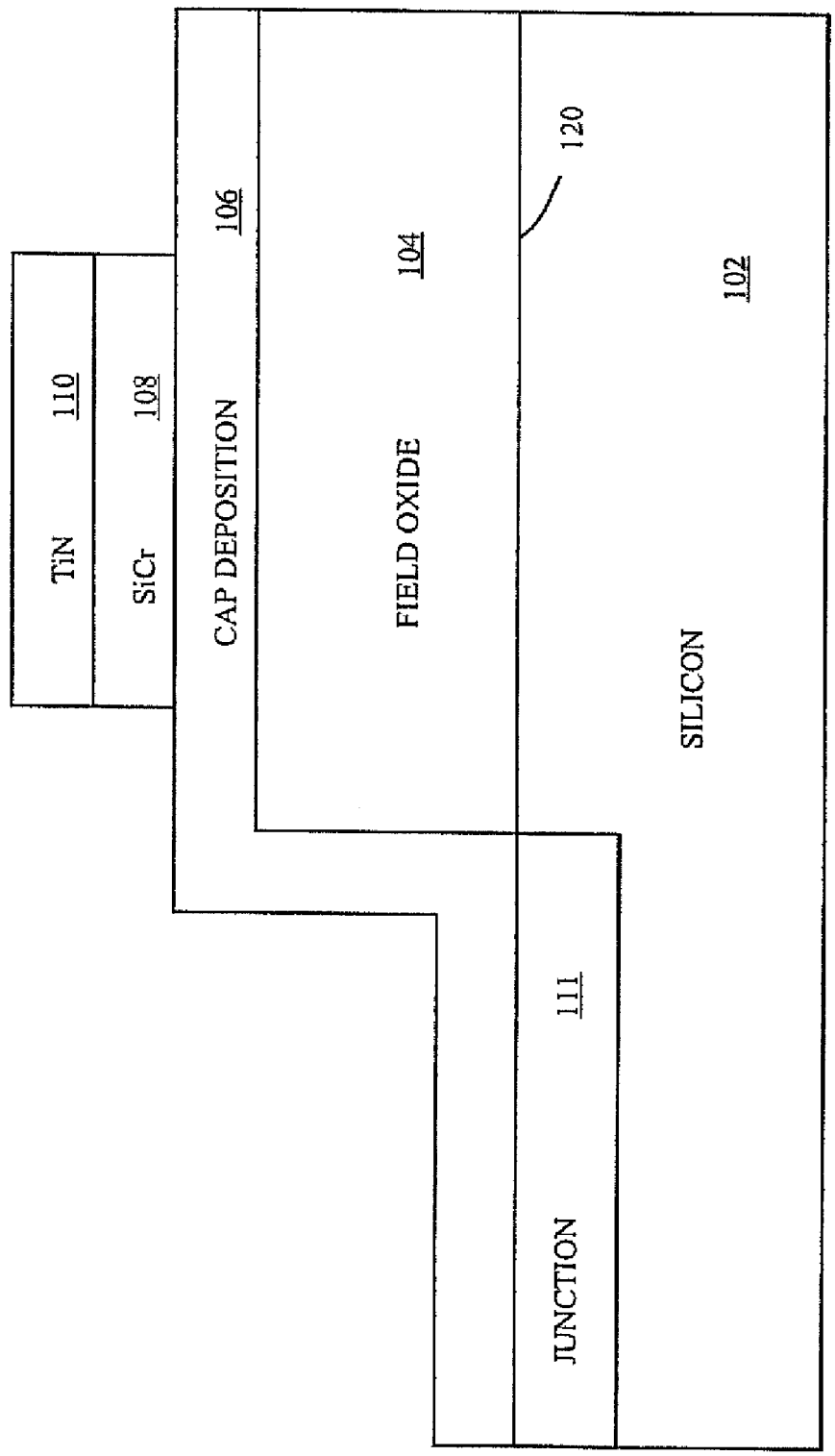

FIG. 2H illustrates another embodiment in patterning the TiN and SiCr layers 110 and 108. In this embodiment, the dry etch of the TiN 110 layer is extended so that it also completely removes select portions of the SiCr layer 108. This embodiment further requires a plasma oxygen clean or a simple diluted HF dip after the solvent strip since the solvent strip is not sufficient to clean the oxide layer 106 surface. As illustrated in FIG. 2H, the edges of the SiCr layer 108 are aligned with the edges of the TiN layer 110. In this embodiment the remaining process steps as discussed in relation to FIGS. 2D through 2F are performed to achieve the semiconductor structure 100 of FIG. 2G.

Figure 3A:
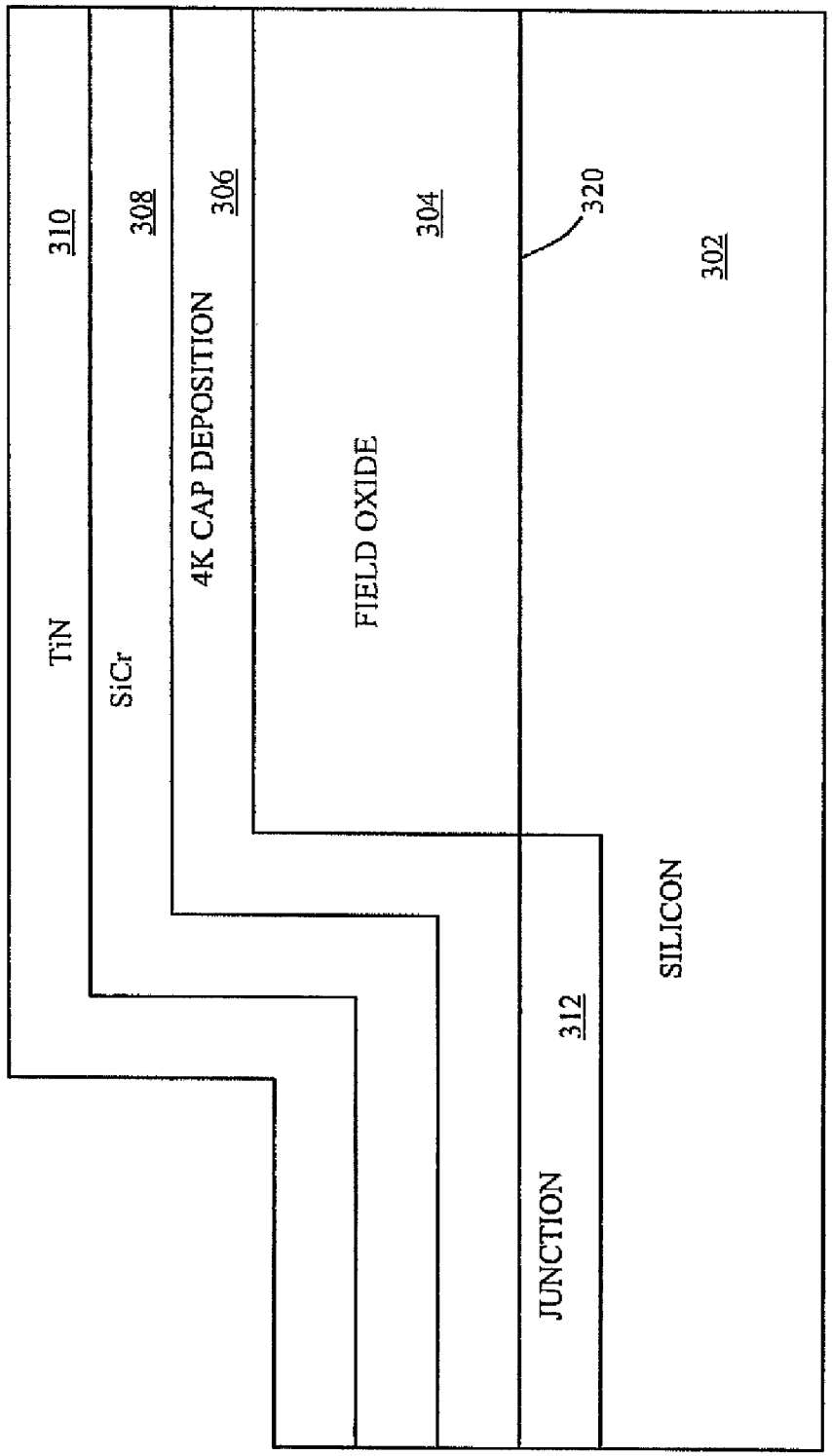
FIG. 3A-3D are cross-sectional views illustrating a process of forming a device and a device of one embodiment of the present invention.
Figure 3B:
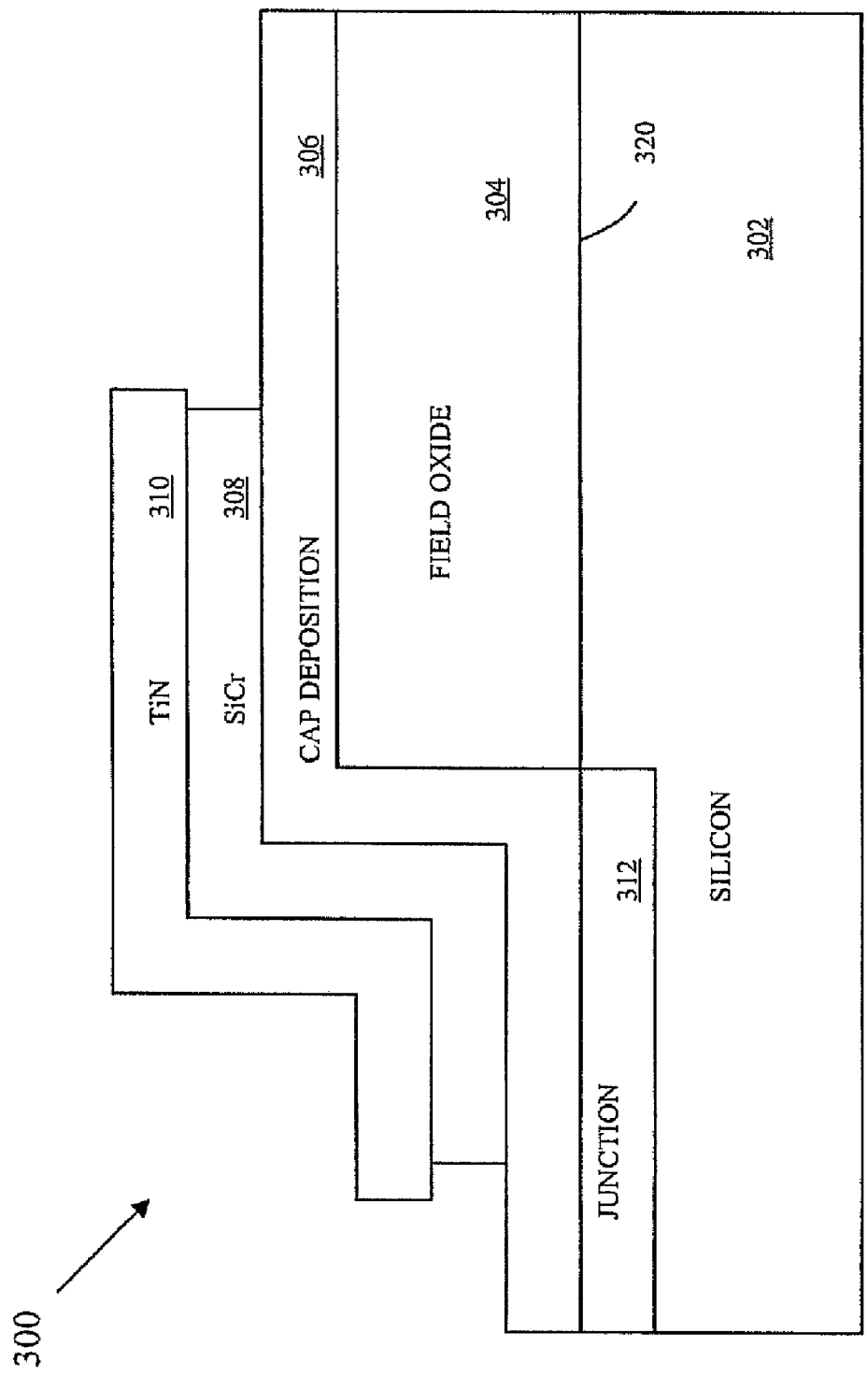

FIGS. 3A through 3B illustrate the formation of another semiconductor device 300 of another embodiment of the present invention using similar processes as discussed above. In this embodiment a capacitor is formed. As illustrated in FIG. 3A, this embodiment starts off similar to the embodiment of FIG. 2A. In particular, a field oxide 304 is deposited and patterned on a silicon wafer 302 (substrate 302). A 4K cap deposition 306 (cap dep layer 306) is deposited overlaying the field oxide 304 and a working surface 320 of the silicon substrate 302. A SiCr layer 308 is then deposited overlaying the cap dep layer 306. A hard mask layer of TiN 310 is then formed overlaying the SiCr layer 108. Also illustrated in FIG. 3A is device junction 312 formed in the substrate 302. In one embodiment, the field oxide 304 is used as a mask in forming the junction 312 and hence the field oxide 304 defines an edge of device junction 312.

Referring to FIG. 3B, the TiN layer and the SiCr layer 308 is etched. In particular, in one embodiment, a patterned resist and timed dry etch is then performed to remove select sections of the TiN layer 110. A solvent strip is then used and a standard SiCr wet etch is performed to produce what is illustrated in FIG. 3B. In another embodiment, the timed dry etch is prolonged so that select portions of the SiCr layer are removed without the SiCr wet etch. In this embodiment, the solvent strip is followed by either a plasma oxygen clean or a diluted HF dip to properly clean the oxide surfaces.

Figure 3C:
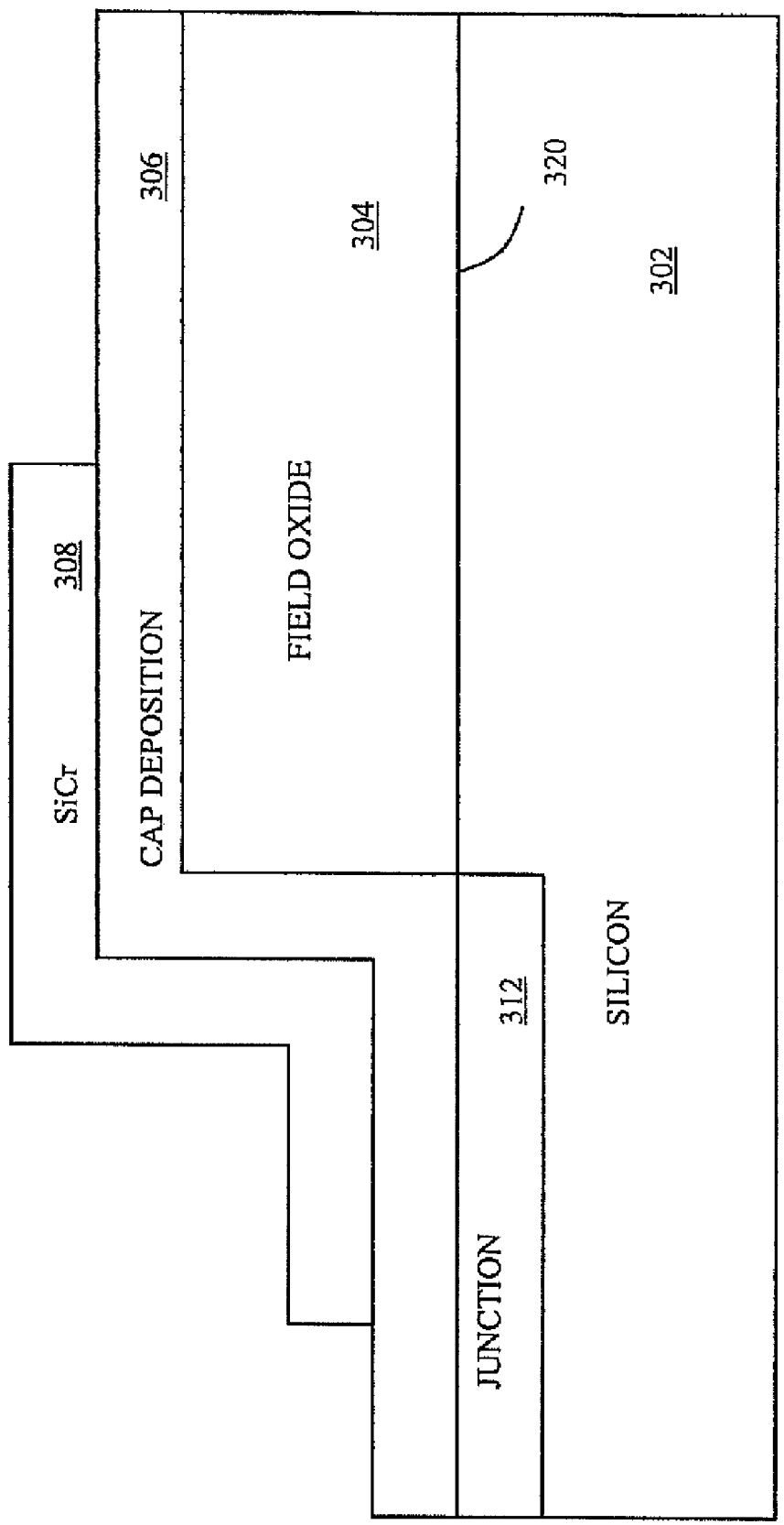

In one embodiment, a pre-clean process is applied. Further in one embodiment, the pre-clean process includes a 40:1 dilute of HF that is applied for approximately 60 seconds, and a 6:1 HCL at approximately 50° C. that is applied for approximately 70 seconds. A Pt strip is then applied. In one embodiment, the Pt strip includes an aqua regia mixture that dissolves some of the remaining TiN layer. A TiN residual etch is then performed to remove the remaining TiN as illustrated in FIG. 3C. A layer of TiW and AlCu are then respectively deposited and patterned as illustrated in FIG. 3D.

Figure 3D:
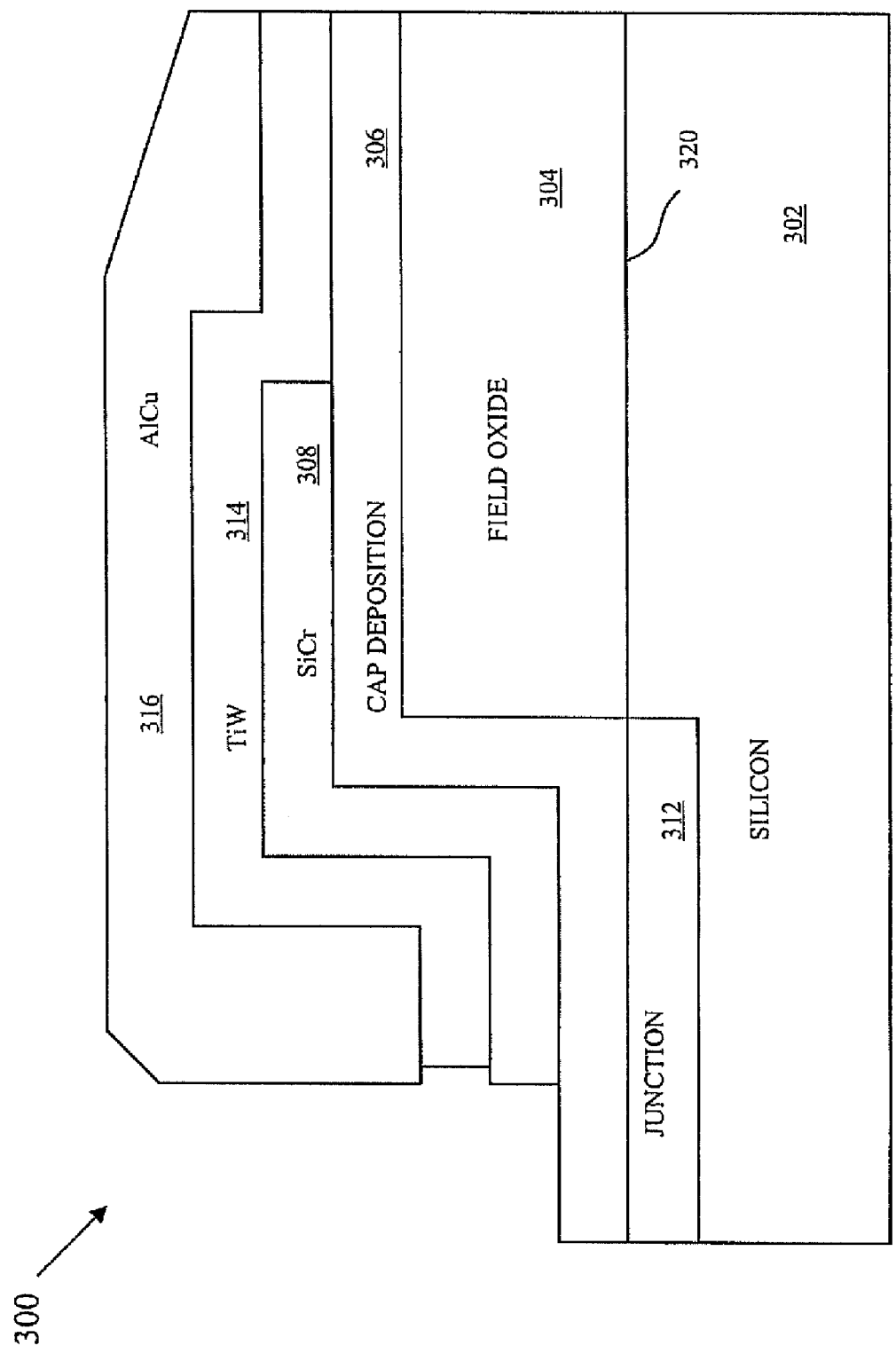

In particular, FIG. 3D illustrates a capacitor device 300 of one embodiment of the present invention. The junction 312 forms a bottom plate of a capacitor and layers 308, 314 and 316 form a top plate of the capacitor. The cap deposition layer 306 is an oxide that separates and prevents shorts between the interconnect metal (which in this embodiment is layers 316, 314 and 308) and the device region (which in this embodiment includes junction 312). This is done by scaling the thickness of the cap deposition layer 106 according to the voltage requirements. This is a trade off against the circuit requirements of thinner oxide in order to get more capacitance per unit area. Thus, an optimal thickness for a given circuit requirement must be selected. The cap deposition layer 306 serves as a capacitor when the device region is highly doped (i.e. junction 312). Embodiments of the resistors with silicide junctions formed in FIGS. 2A through 2H and capacitors as illustrated in FIG. 3A through 3D can be formed together to form components of an integrated circuit. Moreover, a silicide contact junction can be formed to provide an electrical connection to the bottom plate 312 by the methods discussed above.

Figure 4:
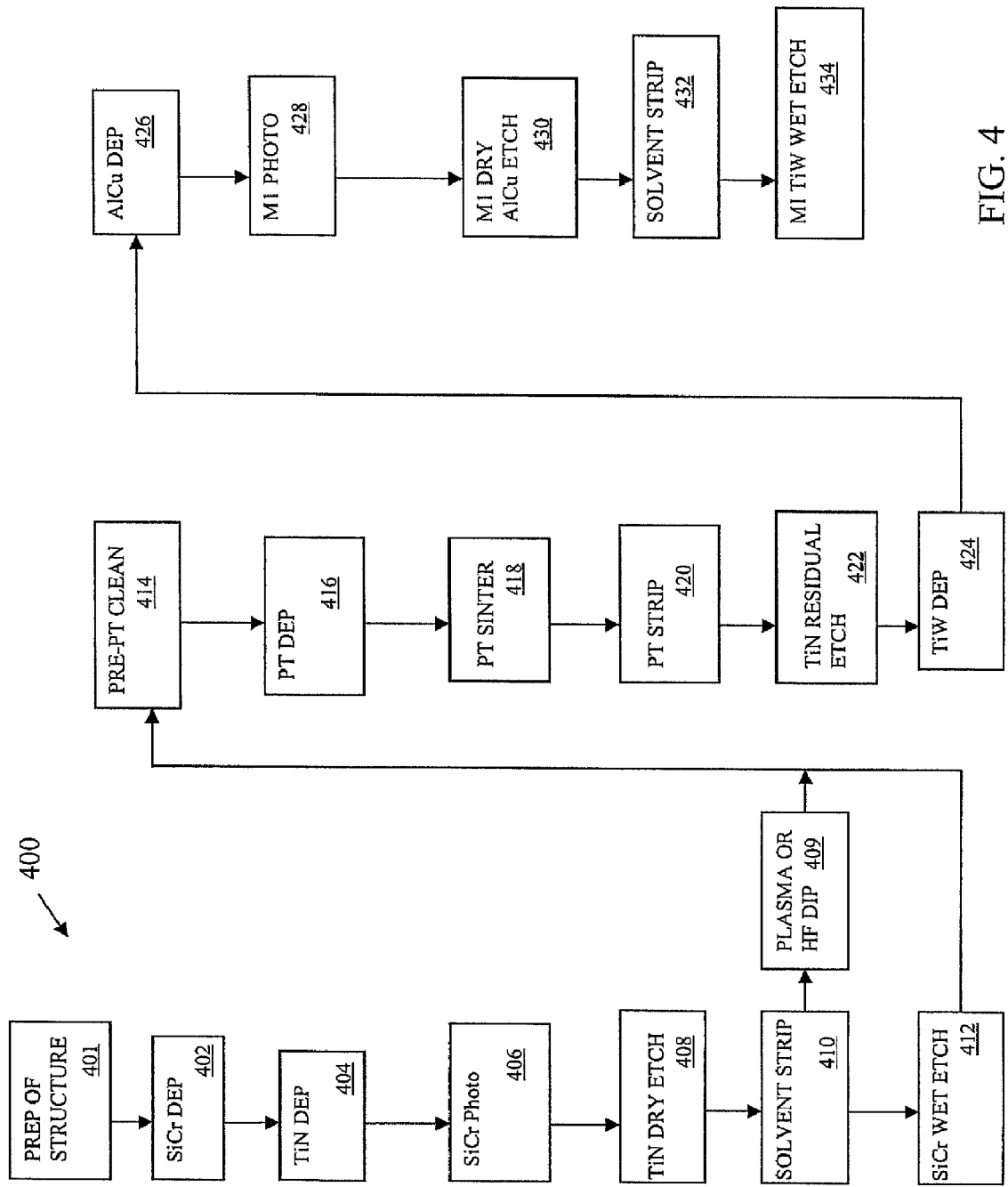
FIG. 4 is a flow diagram of the process of forming a device in one embodiment of the present invention.

A flow diagram 400 illustrating the steps of formation of a device of one embodiment of the present invention is illustrated in FIG. 4. After a field oxide layer has been deposited and patterned on a substrate, a cap deposition layer is deposited overlaying a surface of the substrate and the field oxide to prepare for the formation of the device (401). A SiCr deposition layer is then formed overlaying the cap deposition layer (402). A TiN deposition layer is then formed overlaying the SiCr layer (404). A SiCR photo is applied (406). In this embodiment, the SiCR photo step is actually the combined steps of a dehydration bake, an application of an organic adhesion promoter, the spinning on of a resist coat, an exposing of the pattern, a developing of the resist, and performing a pre-etch resist hard bake. In one embodiment, the organic adhesion promoter is in vapor form. In this embodiment, a patterned resist and timed TiN dry etch is performed to remove part of the TiN layer as well as part of the SiCr layer (408). A solvent strip is then used (410). A SiCr wet etch is then used to remove the SiCr layer from areas not protected by the TiN layer (412).

In another embodiment, the areas of the SiCr layer that are to be removed from the cap deposition layer are done so by extending the timed TiN dry etch (408). In this embodiment, the solvent strip (410) is followed by a plasma oxygen clean or a simple diluted HF dip (409). In this embodiment, the plasma oxygen clean or the HF dip are required after the solvent strip because the solvent strip will not sufficiently clean up the oxide surface.

Next a pre-clean process is applied (414). In one embodiment, the pre-clean process includes a 40:1 dilute of HF that is applied for approximately 60 seconds, and a 6:1 HCL at approximately 50° C. that is applied for approximately 70 seconds. Once the pre-clean process is completed, Pt is deposited (416). A Pt sinter is then performed to form a PtSi junction contact in one embodiment (418). A Pt strip is then applied (420). In one embodiment, the Pt strip includes an aqua regia mixture that dissolves some of the remaining TiN layer. A TiN residual etch is then performed to remove the remaining TiN (422). A layer of TiW is then deposited (424). A layer of AlCu is then deposited overlaying the layer of TiW (426). A M1 photo is applied (428). In this embodiment, the M1 photo step is actually the combined steps of a dehydration bake, the application of an organic adhesion promoter, the spinning on of a resist coat, the exposing of the pattern, a developing of the resist, and performing a pre-etch resist hard bake. A M1 dry etch is then performed to remove a section of AlCu (430). After a solvent strip is used (432), a M1 TiW wet etch is performed (434).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A semiconductor device comprising:
a semiconductor substrate having a working surface;
at least one silicide contact junction adjacent to the working surface of the substrate;
an oxide layer overlaying the working surface of the substrate;
at least one thin film resistor overlaying the oxide layer, the thin film resistor comprising a layer of SiCr;
at least one field oxide between the oxide layer and the working surface of the substrate; and
at least one capacitor.

2. The semiconductor device of claim 1, wherein the silicide contact junction comprises PtSi.

3. The semiconductor device of claim 1, wherein the thin film resistor has a sheet resistance of approximately 2K ohms/square.

4. The semiconductor device of claim 1, wherein the at least one capacitor comprises:
a bottom plate comprising a doped junction in the substrate;
a top plate comprising a layer of SiCr and one or more interconnect metal layers; and
an oxide layer positioned between the bottom and top plates.

5. The semiconductor device of claim 1, wherein the substrate comprises silicon.

6. An integrated circuit comprising:
a semiconductor substrate having a working surface;
at least one field oxide overlaying a select portion of the working surface of the substrate;
at least one silicide contact junction adjacent to the working surface of the substrate;
an oxide layer overlaying the field oxide and portion of the working surface of the substrate;
a resistor layer overlaying a portion of the oxide layer;
a first interconnect layer overlaying the resistor layer, the oxide layer, and the silicide contact junction, the first interconnect layer having an opening to expose a portion of the resistor layer; and
a second interconnect layer overlaying the first interconnect layer, the second interconnect layer having an opening aligned with the opening in the first interconnect layer to the exposed portion of the resistor layer.

7. The integrated circuit of claim 6, further comprising at least one capacitor.

8. The integrated circuit of claim 6, wherein the resistor layer comprises a SiCr layer or a NiCr layer.

9. The integrated circuit of claim 6, wherein the first interconnect layer comprises a TiW layer or a TiN layer.

10. The integrated circuit of claim 6, wherein the second interconnect layer comprises an AlCu layer.

11. The integrated circuit of claim 6, wherein the substrate comprises silicon.

12. An integrated circuit comprising:
at least one capacitor comprising:
a top plate including a SiCr layer and at least one metal layer;
a bottom plate including a doped junction in a substrate of the at least one capacitor; and
an oxide layer positioned between the top plate and the bottom plate; and
at least one resistor including the SiCr layer.

13. The integrated circuit of claim 12, further comprising at least one silicide contact junction in the substrate.

14. The integrated circuit of claim 12, wherein the substrate comprises silicon.

15. An integrated circuit comprising:
at least one patterned field oxide on a working surface of a substrate;
at least one device junction in the substrate, wherein an edge of the at least one patterned field oxide defines an edge of the at least one device junction;
a cap deposition layer overlaying the surface of the substrate and the field oxide, the cap deposition layer having at least one opening to the surface of the substrate adjacent to the at least one device junction;
a silicide contact junction in the at least one opening;
a SiCr layer overlaying the cap deposition layer; and
at least one metal interconnect layer over the SiCr layer.

16. The integrated circuit of claim 15, wherein the substrate comprises silicon.

17. The integrated circuit of claim 15, wherein the interconnect layer comprises a TiW layer or TiN layer.

18. A semiconductor device comprising:
a semiconductor substrate having a working surface;
at least one silicide contact junction adjacent to the working surface of the substrate, the silicide contact junction comprising PtSi.
an oxide layer overlaying the working surface of the substrate; and
at least one thin film resistor overlaying the oxide layer.

19. A semiconductor device comprising:
a semiconductor substrate having a working surface;

at least one silicide contact junction adjacent to the working surface of the substrate;

an oxide layer overlaying the working surface of the substrate;

at least one thin film resistor overlaying the oxide layer; and at least one capacitor comprising:
- a bottom plate comprising a doped junction in the substrate;
- a top plate comprising a layer of SiCr and one or more interconnect metal layers; and
- an oxide layer positioned between the bottom and top plates.

20. A method of forming a semiconductor device, the method comprising:

forming at least one hard mask overlaying at least one layer of resistive material;

forming at least one opening to a working surface of a silicon substrate of the semiconductor device;

cleaning the semiconductor device with a diluted acid process, the diluted acid process comprising:
- applying a dilute of a first acid; and
- applying a dilute of a second acid;

after cleaning with the diluted acid process, forming a silicide contact junction in the at least one of the opening to the working surface of the silicon substrate;

forming interconnect metal layers; and patterning the interconnect metal layers.

21. The method of claim 20, wherein the dilute of the first acid and the dilute of the second acid are not applied at the same time.

22. The method of claim 20, further comprising:
forming at least one oxide layer between the working surface of the silicon substrate and the layer of resistive material.

23. The method of claim 20, further comprising:
removing the hard mask with peroxide after the formation of the at least one silicide contact junction.

24. The method of claim 20, further comprising:
patterning the layer of resistive material to form a resistor.

25. A semiconductor device comprising:

a semiconductor substrate having a working surface;

at least one silicide contact junction adjacent to the working surface of the substrate;

an oxide layer overlaying the working surface of the substrate;

at least one thin film resistor overlaying the oxide layer;

at least one field oxide between the oxide layer and the working surface of the substrate; and at least one capacitor comprising:
- a bottom plate comprising a doped junction in the substrate;
- a top plate comprising a layer of SiCr and one or more interconnect metal layers; and
- an oxide layer positioned between the bottom and top plates.

* * * * *